US012689156B2

(12) United States Patent
Shih

(10) Patent No.: US 12,689,156 B2
(45) Date of Patent: Jul. 21, 2026

(54) CONNECTION MODULE AND SERVER HAVING THE SAME

(71) Applicant: Fulian Precision Electronics (Tianjin) Co., LTD., Tianjin (CN)

(72) Inventor: Tung-Ho Shih, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 413 days.

(21) Appl. No.: 18/234,435

(22) Filed: Aug. 16, 2023

(65) Prior Publication Data

US 2025/0007214 A1 Jan. 2, 2025

(30) Foreign Application Priority Data

Jun. 28, 2023 (CN) .......................... 202310801497.6

(51) Int. Cl.
*H01R 13/635* (2006.01)
*H05K 7/14* (2006.01)
(52) U.S. Cl.
CPC ......... *H01R 13/635* (2013.01); *H05K 7/1487* (2013.01)

(58) Field of Classification Search
CPC .. H01R 13/635; H01R 12/7005; H01R 12/71; H01R 13/629; H05K 7/1487; G06F 1/185; G06F 1/183; G06F 1/181; G06F 1/184; G06F 1/187
See application file for complete search history.

(56) References Cited

U.S. PATENT DOCUMENTS

2024/0168528 A1* 5/2024 Chen ..................... H05K 7/1417
2024/0389250 A1* 11/2024 Zhao ........................ H05K 7/18

* cited by examiner

*Primary Examiner* — Joseph Ortega
(74) *Attorney, Agent, or Firm* — ScienBiziP, P.C.

(57) ABSTRACT
A connection module and a server are provided. The connection module includes a backplane located above a motherboard of the server, a first positioning member located on the backplane, a second positioning member located on the motherboard, and a pushing member. The second positioning member defines a guide slot for receiving the first positioning member. The pushing member is rotatably located on the backplane, and can switch between a first state and a second state when the pushing member rotates relative to the backplane. When the pushing member is in the first state, the first positioning member is inserted into the guide slot to assemble the backplane to the motherboard. When the pushing member is switched from the first state to the second state, the pushing member drives the first positioning member to push the second positioning member, thereby moving the motherboard away from the backplane.

18 Claims, 6 Drawing Sheets

100

200

25

CONNECTION MODULE AND SERVER HAVING THE SAME

FIELD

The subject matter relates to servers, and more particularly, to a connection module and a server having the connection module.

BACKGROUND

Servers may have backplanes and motherboards. The backplane includes a connector, and the motherboard includes an electric terminal connected to the connector. However, since the electric terminal is connected to the connector, the backplane and motherboard are not easily disassembled from each other, making the maintenance of the server inconvenient.

Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
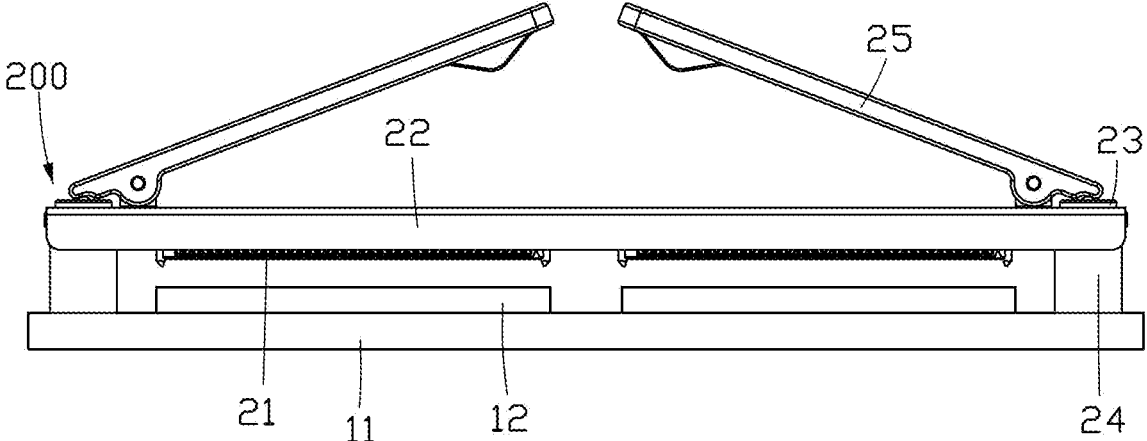
FIG. 1 is a diagrammatic view of a server according to an embodiment of the present application.

It will be appreciated that for simplicity and clarity of illustration, where appropriate, reference numerals have been repeated among the different FIGS. to indicate corresponding or analogous members. In addition, numerous specific details are set forth in order to provide a thorough understanding of the embodiments described herein. However, it will be understood by those of ordinary skill in the art that the embodiments described herein can be practiced without these specific details. In other instances, methods, procedures, and members have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Referring to FIG. 1, a server 100 is provided according to an embodiment of the present application. The server 100 includes a motherboard 11, an electric terminal 12, and a connection module 200. The electric terminal 12 is located on the motherboard 11. The connection module 200 includes a backplane 22 and a connector 21 located on the backplane 22. The backplane 22 is located above the motherboard 11. The electric terminal 12 is located on a surface of the motherboard 11 facing the backplane 22. When the motherboard 11 is assembled to the backplane 22, the connector 21 is aligned with and connected to the electric terminal 12.

Figure 2:
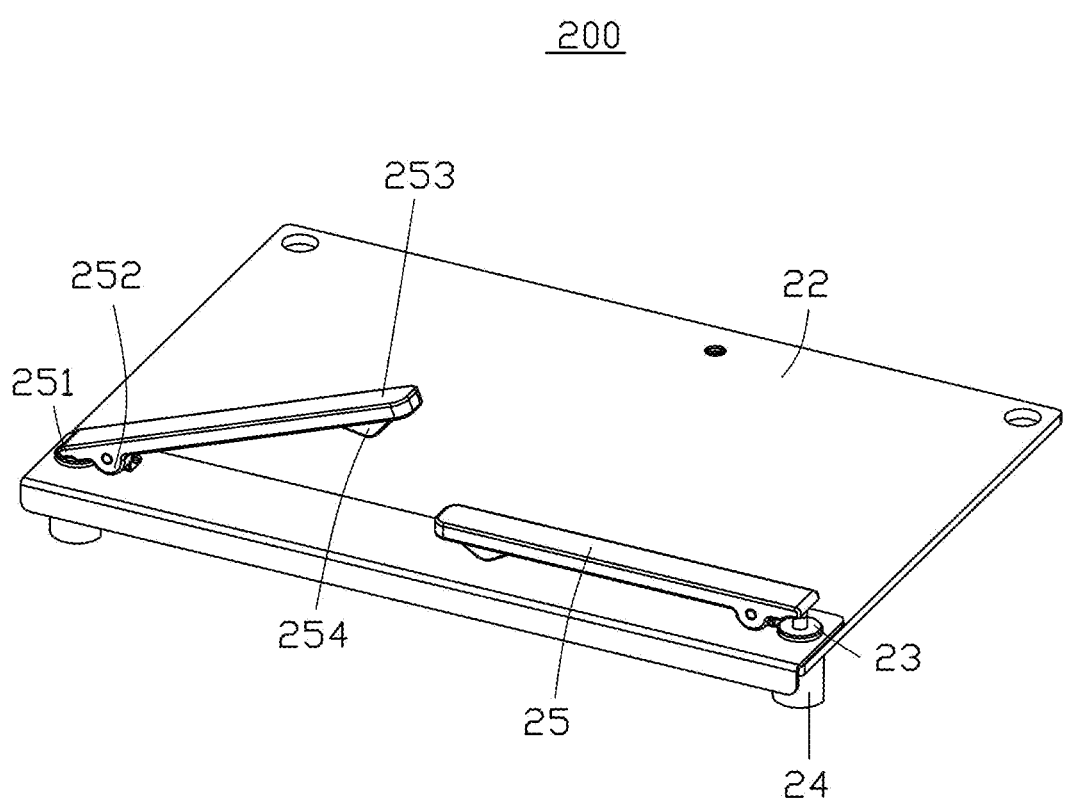
FIG. 2 is a diagrammatic view of a connection module of the server of FIG. 1.
Figure 3:
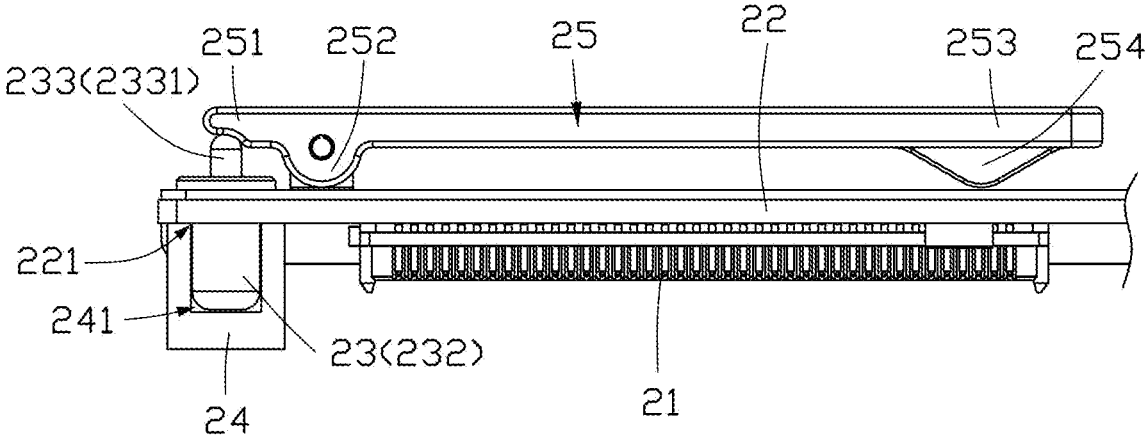
FIG. 3 is a diagrammatic view of a pushing member of the connection module of FIG. 2.

Referring to FIGS. 2 and 3, in at least one embodiment, the connection module 200 further includes a first positioning member 23 and a second positioning member 24. The first positioning member 23 is located on and protrudes from the backplane 22. The second positioning member 24 is located on and protrudes from the motherboard 11. The first positioning member 23 faces the second positioning member 24. The second positioning member 24 defines a guide slot 241 for receiving the first positioning member 23. When the motherboard 11 and the backplane 22 are assembled to each other, the first positioning member 23 is received in the guide slot 241, so that the first positioning member 23 can be positioned on the second positioning member 24. That is, the cooperation between the first positioning member 23 and the guide slot 241 positions the backplane 22 on the motherboard 11. Furthermore, the guide slot 241 can provide a guiding function for the first positioning member 23, thereby improving the assembly accuracy between the backplane 22 and the motherboard 11.

Figure 4:
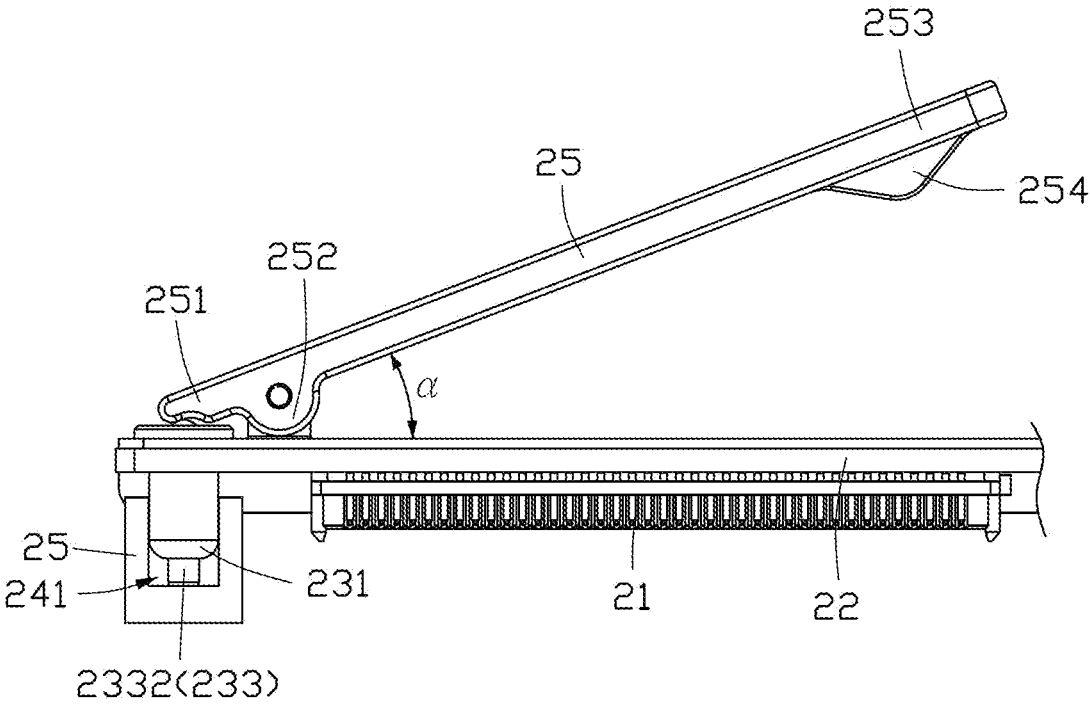
FIG. 4 is similar to FIG. 3, but showing the pushing member in another state.
Figure 5:
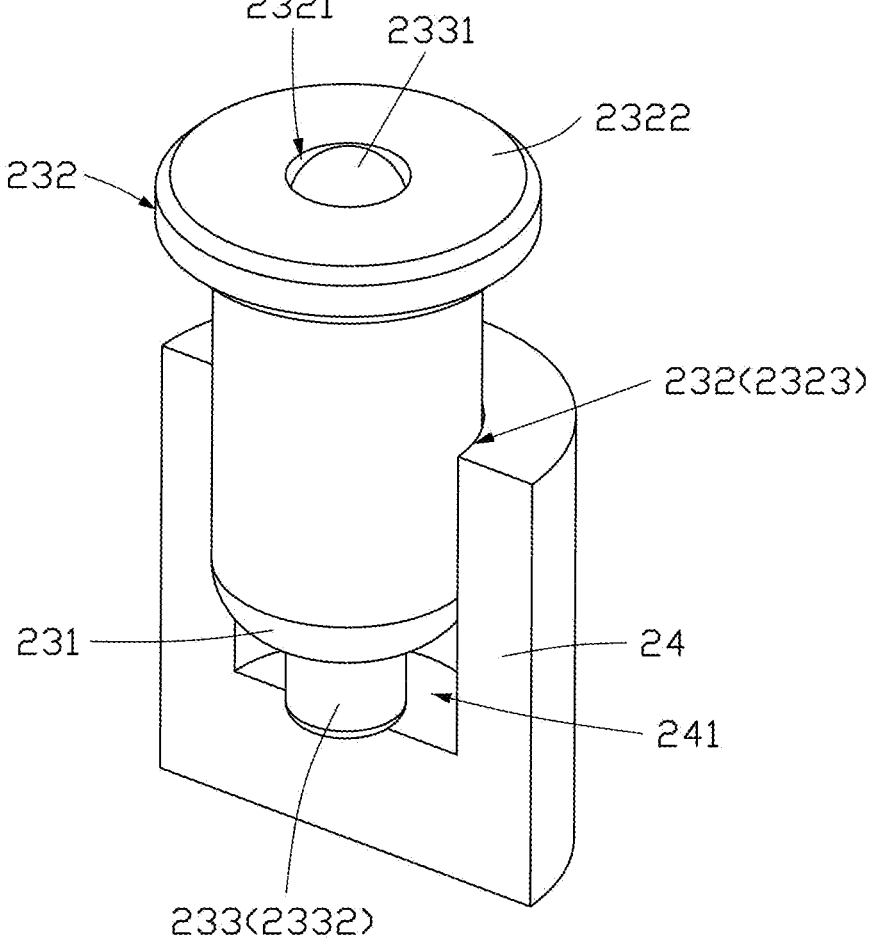
FIG. 5 is a diagrammatic view of a first positioning member and a second positioning member of the connection module of FIG. 3.

Referring to FIGS. 3 to 5, in at least one embodiment, an end of the first positioning member 23 facing the guide slot 241 includes a guide portion 231. Along a direction from the motherboard 11 to the backplane 22, a size of a cross-section of the guide portion 231 gradually increases, and the cross-section of the guide portion 231 is perpendicular to the axial direction of the first positioning member 23 (the first positioning member 23 can be inserted into the guide slot 241 along the axial direction of the first positioning member 23). Thus, when the first positioning member 23 is inserted into the guide slot 241, the end of the first positioning member 23 facing the guide slot 241 first enters the guide slot 241. Then, the guide portion 231 can guide the second positioning member 23 into the guide slot 241, thereby facilitating the connection between the first positioning member 23 and the second positioning member 24.

The connection module 200 further includes a pushing member 25 rotatably located on the backplane 22. When the pushing member 25 rotates relative to the backplane 22, the pushing member 25 can be switched between a first state and a second state. Referring to FIG. 3, when the pushing member 25 is in the first state, the first positioning member 23 can be inserted into the guide slot 241 to position the backplane 22 to the motherboard 11. Referring to FIG. 4, when the pushing member 25 is switched from the first state to the second state, the pushing member 25 can drive the first positioning member 23 to push the second positioning member 24, thereby moving the motherboard 11 away from the backplane 22.

With the above configuration, when the pushing member 25 rotates relative to the backplane 22, the pushing member 25 can drive the first positioning member 23 to push the second positioning member 24, thereby causing the second positioning member 24 to move relative to the backplane 22. As such, the motherboard 11 moves away from the backplane 22, thereby enabling the motherboard 11 to disassemble from the backplane 22. The setting of the pushing member 25 improves the convenience of disassembling the backplane 22 from the motherboard 11. When the motherboard 11 or the backplane 22 is damaged, the user only needs to rotate the pushing member 25 to move the backplane 22 away from motherboard 11.

Referring to FIGS. 3 to 5, in at least one embodiment, the pushing member 25 is located on a surface of the backplane 22 away from the second positioning member 24. The first positioning member 23 includes a first positioning column 232 and a second positioning column 233. The first positioning column 232 defines a guide hole 2321 extending through two opposite surfaces of the backplane 22. The second positioning column 233 passes through the guide hole 2321, and can slide in the guide hole 2321 relative to the first positioning column 232. An end of the second positioning column 233 near the pushing member 25 is a first end 2331, and another end of the second positioning column 233 away from the pushing member 25 is a second end 2332. When the pushing member 25 is in the first state, the first positioning column 232 is inserted into the guide slot 241. The bottom surface of the guide slot 241 supports the second end 2332 (that is, the second end 2332 is received in the guide slot 241), and the first end 2331 protrudes from the guide hole 2321. When the pushing member 25 is switched from the first state to the second state, the pushing member 25 pushes the first end 2331, causing the second end 2332 to protrude from the guide hole 2321 and to push second positioning member 24. As such, the motherboard 11 moves away from the backplane 22.

In at least one embodiment, along the axial direction of the first positioning member 23, a length of the first positioning column 232 is smaller than a length of the second positioning column 233. The first positioning column 232 includes an installation portion 2322 and a positioning portion 2323 connected to the installation portion 2322. The installation portion 2322 and the positioning portion 2323 are substantially cylindrical in shape. The backplane 22 defines an installation hole 221. A diameter of the installation portion 2322 is greater than a diameter of the installation hole 221. The installation portion 2322 is located on a surface of the backplane 22 facing the pushing member 25. A portion of the positioning portion 2323 is located in the installation hole 221, and a remaining portion of the positioning portion 2323 is located on a surface of the backplane 22 away from the pushing member 25 (that is, a surface of the backplane 22 facing the second positioning member 24) and used to be inserted into the guide slot 241. The guide hole 2321 extends through an end surface of the positioning portion 2323 facing the pushing member 25, and also extends through an end surface of the installation portion 2322 facing the bottom surface of the guide slot 241.

When the positioning member 2323 of the first positioning column 232 is pulled out of the guide slot 241, the positioning member 2323 is subjected to a friction force from the inner wall of the guide slot 241 and has a tendency to move toward the bottom surface of the guide slot 241. Since the diameter of the installation portion 2322 is larger than the diameter of the installation hole 221, the installation portion 2322 is prevented from entering the installation hole 221, thereby limiting the movement of the positioning portion 2323 toward the bottom surface of the guide slot 241. As such, the connection between the first positioning column 232 and the backplane 22 is stable, which can prevent the first positioning column 232 from separating from the backplane 22 when the backplane 22 is disassembled from the motherboard 11.

In at least one embodiment, the outer periphery of the second positioning column 233 is in contact with the inner wall of the guide hole 2321, so that the frictional force is generated between the outer periphery of the second positioning column 233 and the inner wall of the guide hole 2321. The frictional force is used to keep the second positioning column 233 stationary with respect to the first positioning column 232 without any external force. As such, when the pushing member 25 rotates relative to the backplane 22 and pushes the second positioning column 233, the second positioning column 233 can slide in the guide hole 2321 and push the second positioning member 24. When the pushing member 25 stops rotating relative to the backplane 22, the second positioning column 233 stays stationary in the guide hole 2321. In the above embodiment, when the first positioning member 23 is separated from the second positioning member 24, the friction force between the second positioning column 233 and the first positioning column 232 prevents the first positioning column 232 from being separated from the second positioning column 233, thereby avoiding a loss of the second positioning column 233.

In at least one embodiment, the end of the first positioning column 232 facing the guide slot 241 is the guide portion 231. When the first positioning member 23 is connected to the second positioning member 24, the second end 2332 is located in the guide hole 2321 and flush with the end surface of the guide portion 231. As such, the end surface of the second end 2332 facing the guide slot 241 and the end surface of the first positioning column 232 facing the guide slot 241 can both be in contact with the bottom surface of the guide slot 241. Thus, the connection between the first positioning member 23 and the second positioning member 24 can be stable.

In at least one embodiment, the pushing member 25 is rotatably connected to the first end 2331. When the pushing member 25 rotates, the first end 2331 also rotates relative to the pushing member 25, and the pushing member 25 can drive the second positioning column 233 to slide in the guide hole 2321. In addition, since the pushing member 25 is rotatably connected to the first end 2331, the first end 2331 is prevented from being misaligned with the pushing member 25 when the pushing member 25 rotates. Thus, the pushing member 25 can apply a stable force onto the first end 2331 when the pushing member 25 pushes the first end 2331.

In at least one embodiment, the second end 2332 can be fixed to the bottom surface of the guide slot 241. When the first positioning column 232 is inserted into the guide slot 241, the second positioning column 233 is also inserted into the guide hole 2321 along the axial direction of the guide hole 2321. The cooperation between the second positioning column 233 and the guide hole 2321 further provides a guiding function for the assembly of the backplane 22 and the motherboard 11, thereby facilitating the connection between the backplane 22 and the motherboard 11. Since the second end 2332 is fixed to the bottom surface of the guide slot 241, when the pushing member 25 pushes the first end 2331, the second positioning column 233 and the second positioning member 24 can simultaneously move away from the backplane 22 when pushed by the pushing member 25, thereby separating the motherboard 11 from the backplane 22.

In at least one embodiment, the first positioning column 232 is made of rubber. Each of the second positioning column 233 and the second positioning member 24 is made of metal or plastic. The rubber can provide a large friction force, which allows the connection between the first positioning column 232 and the second positioning column 233 or the second positioning member 24 to be stable.

Figure 6:
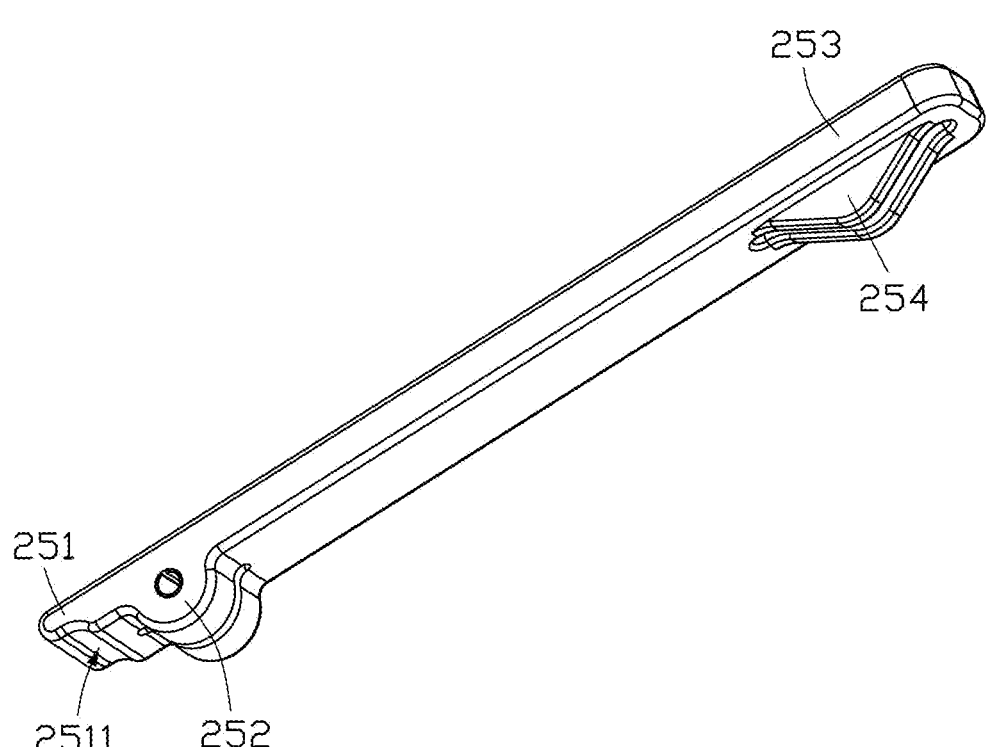
FIG. 6 is a diagrammatic view of a pushing member of the connection module of FIG. 3.

Referring to FIGS. 3, 4, and 6, in at least one embodiment, the pushing member 25 includes a pushing portion 251, a connection portion 252, and an operation portion 253. The connection portion 252 connects the operation portion 253 to the pushing portion 251. The connection portion 252 is rotatably connected to the backplane 22. When the pushing member 25 rotates, the pushing portion 251 can push the first positioning member 23. In operation, the operation portion 253 is rotated by an external force, and the operation portion 253 then drives the pushing portion 251 to rotate. When the pushing portion 251 rotates, the pushing portion 251 pushes the first positioning member 23, and the first positioning member 23 then pushes the second positioning member 24 to move away from the backplane 22.

In at least one embodiment, a distance between the connection portion 252 and the pushing portion 251 is smaller than a distance between the connection portion 252 and the operation portion 253. As such, when the external force is applied to the end of the operation portion 253 away from the pushing portion 251, the distance from the external force to the connection portion 252 is greater than the distance between the connection portion 252 and the pushing portion 251. Therefore, the separating portion 25 forms a force-saving lever, and the operation portion 253 forms a power arm. According to the lever principle, the convenience of disassembling the backplane 22 and the motherboard 11 is improved. Compared to directly applying the external force on the backplane 22 to separate the motherboard 11 from the backplane 22, the present application has a labor-saving effect.

In at least one embodiment, the pushing member 25 further includes a limiting portion 254 located on a surface of the operation portion 253 facing the backplane 22. When the pushing member 25 is in the first state, the limiting portion 254 is located between the operation portion 253 and the backplane 22, and is in contact with the backplane 22. The limiting portion 254 prevents the operation portion 253 from being in contact with the backplane 22. Thus, the user can operate and lift up the operation portion 253 relative to the backplane 22.

In at least one embodiment, the pushing member 25 is substantially a long rod. When the pushing member 25 is in the first state, the pushing member 25 is substantially parallel to the backplane 22. When the pushing member 25 is switched from the first state to the second state, an angle α is formed between the pushing member 25 and the backplane 22. The angle α is less than or equal to 45 degrees. The above angle allows the motherboard 11 to separate from the backplane 22, and also reduces the space occupied by the pushing member 25 when the pushing member 25 rotates.

In at least one embodiment, the pushing portion 251 has an arc-shaped pushing surface 2511. The pushing surface 2511 is used to push the first end 2331. The end surface of the first end 2331 is also an arc-shaped surface. The pushing surface 2511 of the pushing surface 2511 matches the end surface of the first end 2331 in shape. Thus, when the pushing surface 2511 pushes the first end 2331, the pushing surface 2511 rolls relative to the end surface of the first end 2331. Thus, the friction between the pushing surface 2511 and the end surface of the first end 2331 is a rolling friction, thereby avoiding abrasive wear generated between the pushing surface 2511 and the first end 2331.

Referring to FIGS. 1 and 2, in at least one embodiment, the motherboard 11 includes a number of electric terminals 12, and the backplane 22 includes a number of connectors 21. The electric terminals 12 correspond and are connected to the connectors 21 one by one. The connection module 200 includes a number of pushing members 25, a number of first positioning members 23, and a number of second positioning members 24. Each pushing member 25 cooperates with one of the first positioning members 23 and one of the second positioning members 24. The pushing members 25 can rotate together to separate the motherboard 11 from the backplane 22.

In the present application, when the electric terminal 12 on the motherboard 11 is connected to the connector 21 on the backplane 22, the first positioning member 23 is inserted into the guide slot 241, thereby connecting the first positioning member 23 to the second positioning member 24. As such, the motherboard 11 and the backplane 22 are connected to each other. When the electric terminal 12 on the motherboard 11 needs to be separated from the connector 21 on the backplane 22, the pushing member 25 is rotated to push the first positioning member 23. The first positioning member 23 then pushes the second positioning member 24 away from the backplane 22, thereby separating the motherboard 11 from the backplane 22.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present exemplary embodiments, to the full extent indicated by the plain meaning of the terms in which the appended claims are expressed.

What is claimed is:

1. A connection module applied to a server, the server comprising a motherboard, the connection module comprising:

a backplane configured to be located above the motherboard;

a first positioning member located on the backplane;

a second positioning member configured to be located on the motherboard, the second positioning member defining a guide slot for receiving the first positioning member; and a pushing member rotatably located on the backplane, and the pushing member being configured to switch between a first state and a second state when the pushing member rotates relative to the backplane;

wherein when the pushing member is in the first state, the first positioning member is inserted into the guide slot to assemble the backplane to the motherboard, when the pushing member is switched from the first state to the second state, the pushing member drives the first positioning member to push the second positioning member, thereby moving the motherboard away from the backplane;

wherein the first positioning member comprises a first positioning column and a second positioning column, the first positioning column defines a guide hole extending through two opposite surfaces of the backplane, the second positioning column is configured to slide in the guide hole, and the pushing member is located on a surface of the backplane away from the second positioning member;

the second positioning column comprises a first end close to the pushing member and a second end away from the pushing member; when the pushing member is in the first state, the first positioning column is inserted into the guide slot, a bottom surface of the guide slot supports the second end, and the first end protrudes from the guide hole; when the pushing member is switched from the first state to the second state, the pushing member pushes the first end, causing the second end to protrude from the guide hole and to push the second positioning member.

2. The connection module of claim 1, wherein the pushing member is rotatably connected to the first end.

3. The connection module of claim 1, wherein the second end is fixed to the bottom surface of the guide slot.

4. The connection module of claim 1, wherein the pushing member comprises a pushing portion, a connection portion, and an operation portion, the connection portion connects the operation portion to the pushing portion, the connection portion is rotatably connected to the backplane, and the pushing portion is configured to drive the first positioning member to push the second positioning member.

5. The connection module of claim 4, wherein a distance between the connection portion and the pushing portion is less than a distance between the connection portion and the operation portion.

6. The connection module of claim 4, wherein the pushing member further comprises a limiting portion located between the operation portion and the backplane, and when the pushing member is in the first state, the limiting portion is in contact with the backplane.

7. The connection module of claim 4, wherein the pushing portion has a pushing surface for pushing the first end, the pushing surface is arc-shaped and in contact with an end surface of the first end.

8. The connection module of claim 1, wherein the first positioning column comprises an installation portion and a positioning portion connected to the installation portion, the backplane defines an installation hole, a diameter of the installation portion is greater than a diameter of the installation hole, the installation portion is located on the surface of the backplane away from the second positioning member, a portion of the positioning portion is configured to be located in the installation hole, and a remaining portion of the positioning portion is configured to be located on a surface of the backplane facing the second positioning member.

9. The connection module of claim 1, wherein an end of the first positioning member facing the guide slot comprises a guide portion, and a size of a cross-section of the guide portion gradually increases along a direction from the motherboard to the backplane.

10. A server comprising:

a motherboard;

an electric terminal located on the motherboard; and a connection module comprising:

a backplane located above the motherboard and comprising a connector, the connector being configured to connect to the electric terminal;

a first positioning member located on the backplane;

a second positioning member located on the motherboard, the second positioning member defining a guide slot for receiving the first positioning member; and a pushing member rotatably located on the backplane, and the pushing member being configured to switch between a first state and a second state when the pushing member rotates relative to the backplane;

wherein when the pushing member is in the first state, the first positioning member is inserted into the guide slot to assemble the backplane to the motherboard, when the pushing member is switched from the first state to the second state, the pushing member drives the first positioning member to push the second positioning member, thereby moving the motherboard away from the backplane;

wherein the first positioning member comprises a first positioning column and a second positioning column, the first positioning column defines a guide hole extending through two opposite surfaces of the backplane, the second positioning column is configured to slide in the guide hole, and the pushing member is located on a surface of the backplane away from the second positioning member;

the second positioning column comprises a first end close to the pushing member and a second end away from the pushing member; when the pushing member is in the first state, the first positioning column is inserted into the guide slot, a bottom surface of the guide slot supports the second end, and the first end protrudes from the guide hole; when the pushing member is switched from the first state to the second state, the pushing member pushes the first end, causing the second end to protrude from the guide hole and to push the second positioning member.

11. The server of claim 10, wherein the pushing member is rotatably connected to the first end.

12. The server of claim 10, wherein the second end is fixed to the bottom surface of the guide slot.

13. The server of claim 10, wherein the pushing member comprises a pushing portion, a connection portion, and an operation portion, the connection portion connects the operation portion to the pushing portion, the connection portion is rotatably connected to the backplane, and the pushing portion is configured to drive the first positioning member to push the second positioning member.

14. The server of claim 13, wherein a distance between the connection portion and the pushing portion is less than a distance between the connection portion and the operation portion.

15. The server of claim 13, wherein the pushing member further comprises a limiting portion located between the operation portion and the backplane, and when the pushing member is in the first state, the limiting portion is in contact with the backplane.

16. The server of claim 13, wherein the pushing portion has a pushing surface for pushing the first end, the pushing surface is arc-shaped and in contact with an end surface of the first end.

17. The server of claim 10, wherein the first positioning column comprises an installation portion and a positioning portion connected to the installation portion, the backplane defines an installation hole, a diameter of the installation portion is greater than a diameter of the installation hole, the installation portion is located on the surface of the backplane away from the second positioning member, a portion of the positioning portion is configured to be located in the installation hole, and a remaining portion of the positioning portion is configured to be located on a surface of the backplane facing the second positioning member.

18. The server of claim 10, wherein an end of the first positioning member facing the guide slot comprises a guide portion, and a size of a cross-section of the guide portion gradually increases along a direction from the motherboard to the backplane.

\* \* \* \* \*